United States Patent
Dozaka

(10) Patent No.: US 9,728,237 B2
(45) Date of Patent: Aug. 8, 2017

(54) DETERMINATION CIRCUIT

(71) Applicant: Kabushiki Kaisha Toshiba, Minato-ku, Tokyo (JP)

(72) Inventor: Toshiaki Dozaka, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/053,624

(22) Filed: Feb. 25, 2016

(65) Prior Publication Data
US 2017/0076764 A1    Mar. 16, 2017

(30) Foreign Application Priority Data
Sep. 11, 2015    (JP) .................. 2015-179387

(51) Int. Cl.
*H03L 5/00*    (2006.01)
*G11C 7/12*    (2006.01)

(52) U.S. Cl.
CPC ..................... *G11C 7/12* (2013.01)

(58) Field of Classification Search
CPC ..................................... G11C 7/12
USPC ............... 365/150, 154–156, 203, 205–207; 327/306
See application file for complete search history.

(56) References Cited

U.S. PATENT DOCUMENTS

| 6,046,956 A | 4/2000 | Yabe |
| 2012/0075936 A1 | 3/2012 | Fujimura |
| 2015/0016183 A1* | 1/2015 | Sinangil ................. G11C 7/065 365/156 |

FOREIGN PATENT DOCUMENTS

JP    2001-202775 A    7/2001

* cited by examiner

*Primary Examiner* — Lincoln Donovan
*Assistant Examiner* — Diana J Cheng
(74) *Attorney, Agent, or Firm* — White & Case LLP

(57) ABSTRACT

A determination circuit of one embodiment includes first and second inverter circuits, a first transistor which turns on when receiving an asserted first signal, and a first capacity component including a first end which receives an inversion signal of the first signal. The second inverter circuit includes an input coupled to an output of the first inverter circuit, and includes an output coupled to an input of the first inverter circuit. The first node is coupled to a first potential node, the first transistor is coupled between the second node and a second potential node having a lower potential than a potential of the first potential node, and a second end of the first capacity component is coupled to the second node.

8 Claims, 15 Drawing Sheets

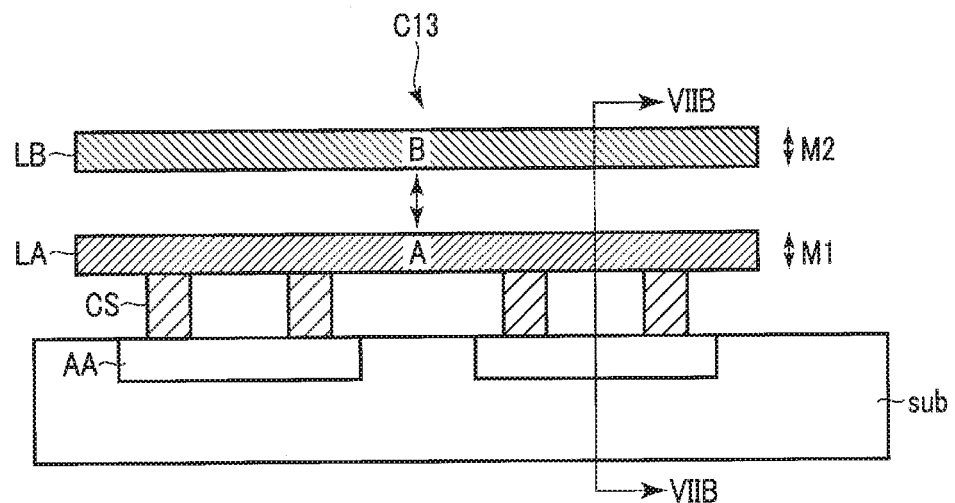
F I G. 7A
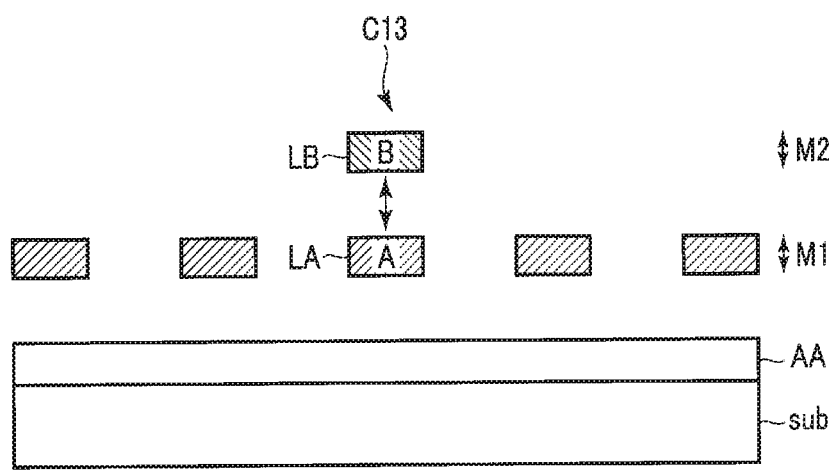
F I G. 7B

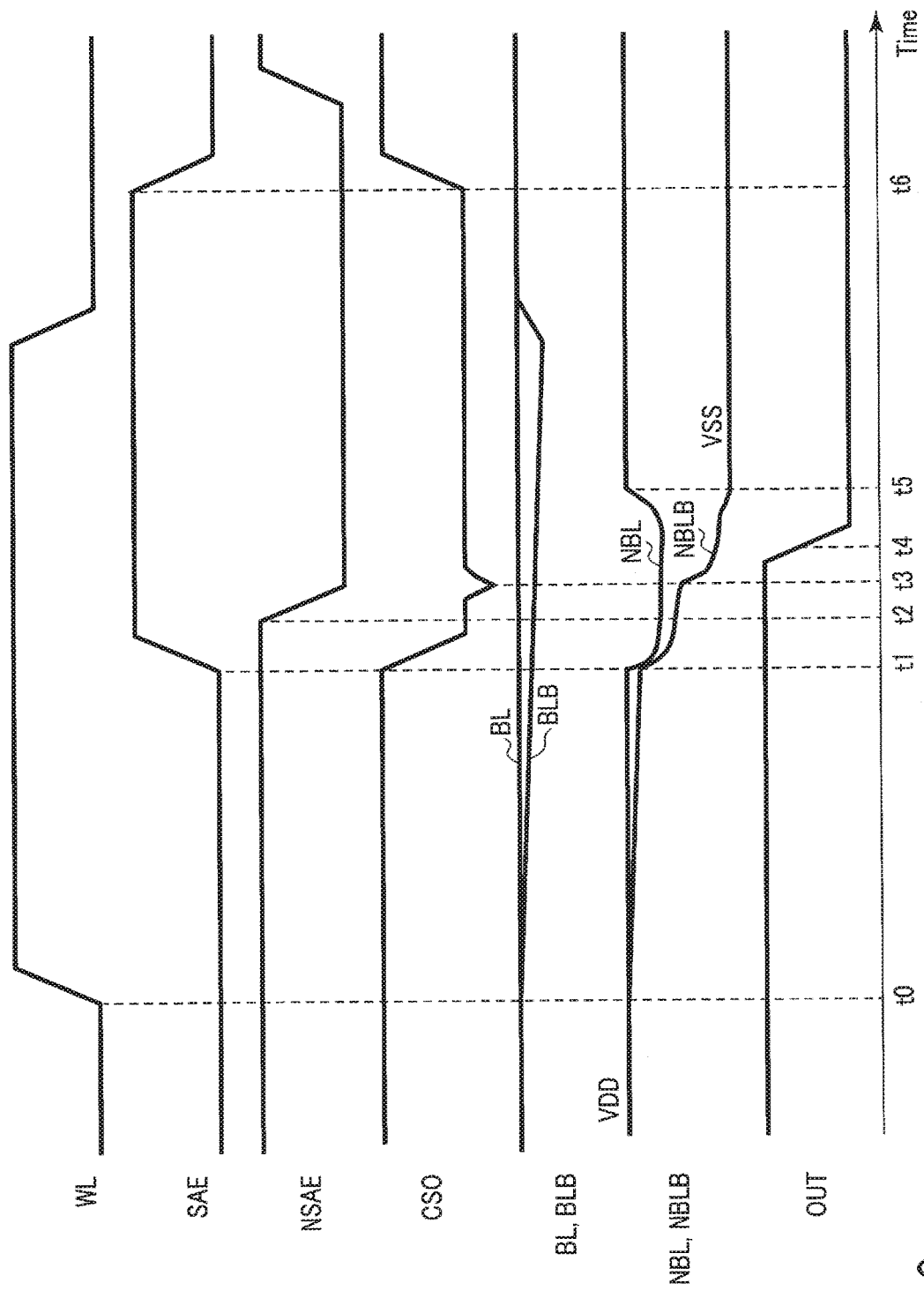
F I G. 9

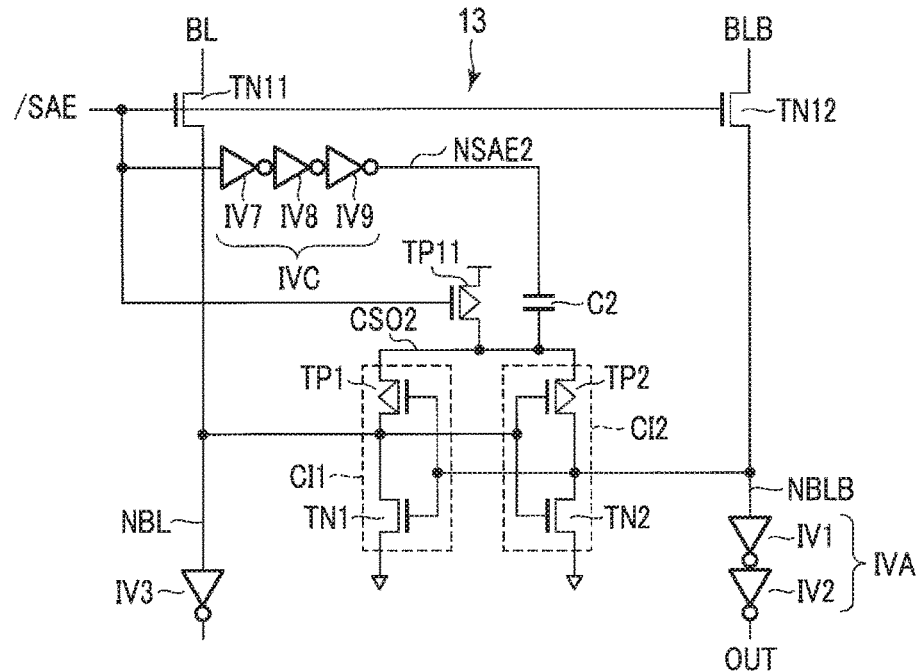
F I G. 10
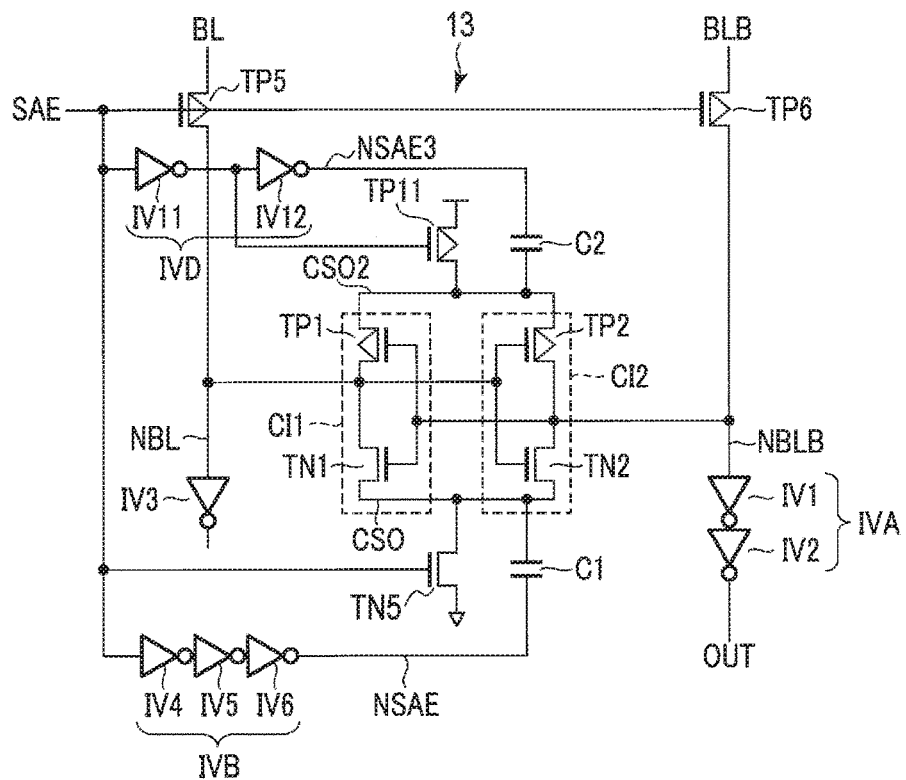
F I G. 11

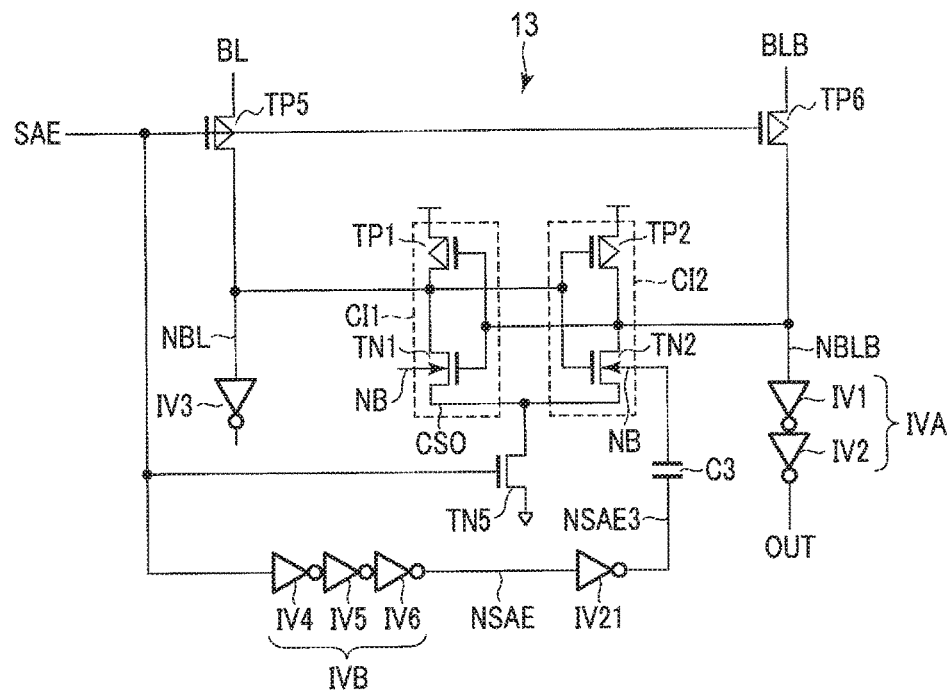
F I G. 14
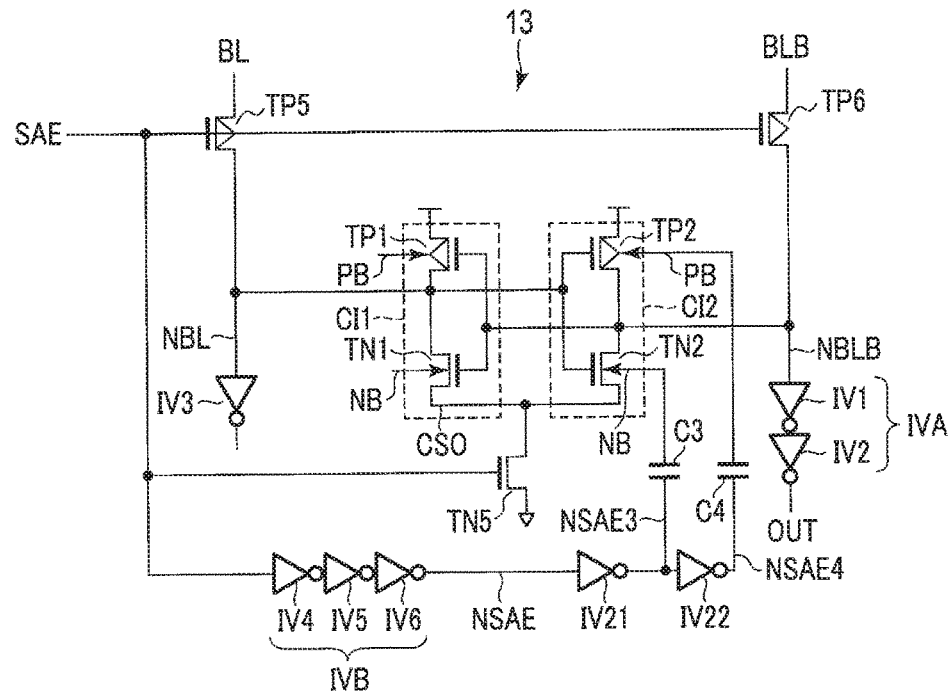
F I G. 15

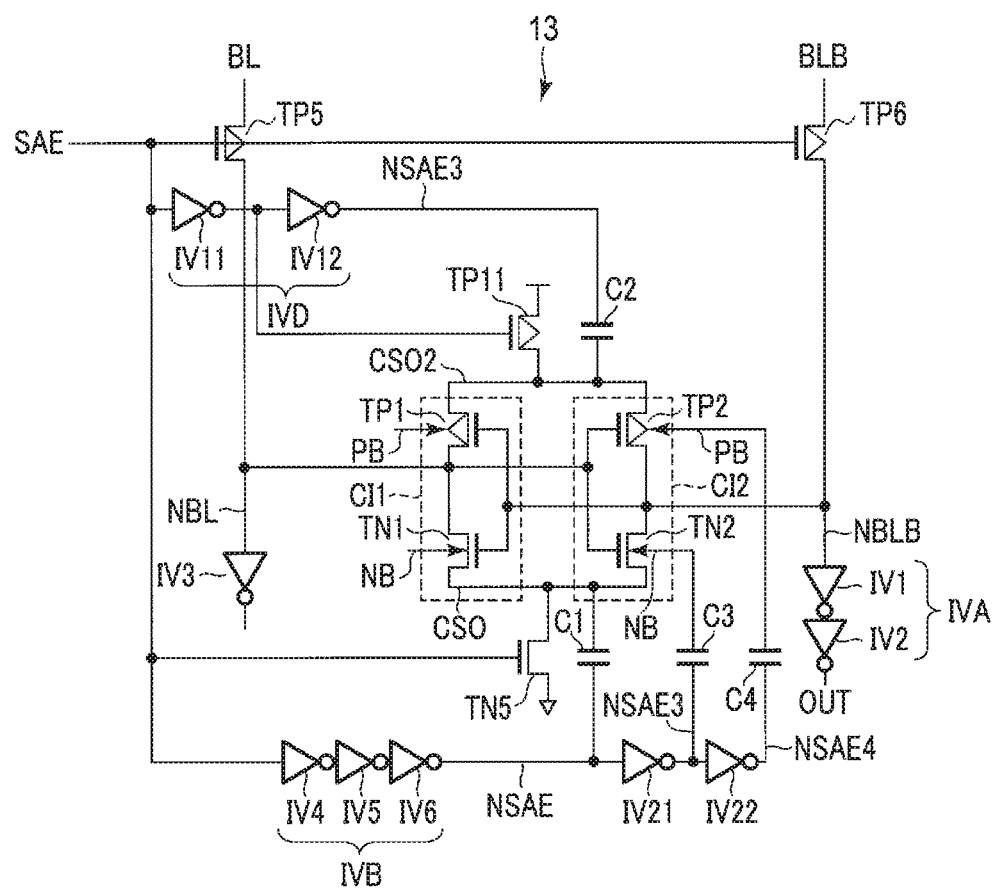
F I G. 18

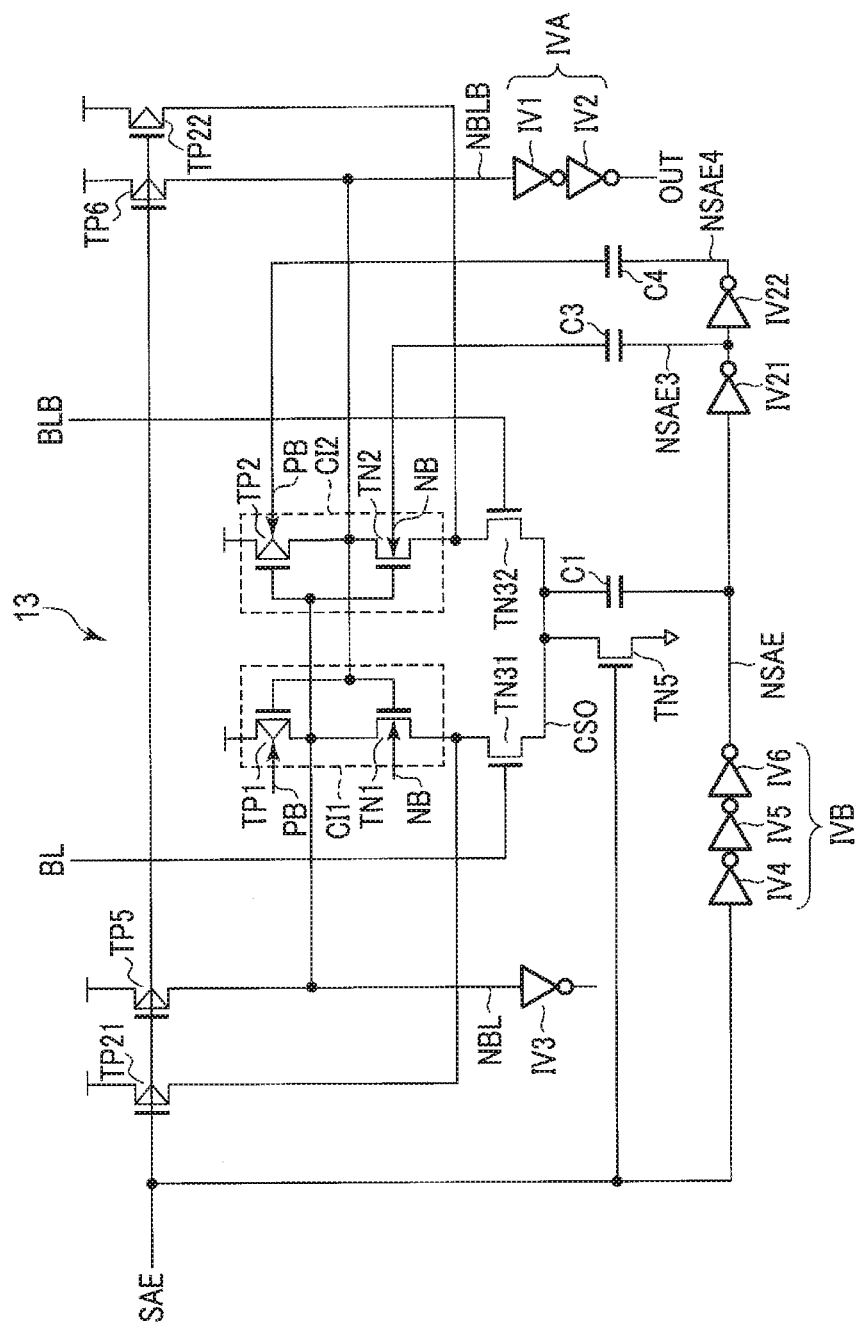
F I G. 19

US 9,728,237 B2

DETERMINATION CIRCUIT

CROSS-REFERENCE TO RELATED APPLICATIONS

This application is based upon and claims the benefit of priority from Japanese Patent Application No. 2015-179387, filed Sep. 11, 2015, the entire contents of which are incorporated herein by reference.

FIELD

Embodiments relate to a determination circuit.

BACKGROUND

One kind of semiconductor memory device latches potentials on two nodes which make a pair in a memory cell, and stores data with the combination of the potentials of the two nodes. Such a semiconductor memory device includes a determination circuit to determine the data of a memory cell of a read target. The determination circuit amplifies the difference of the potentials of two nodes of the read-target memory cell. The determination circuit needs to operate at a high speed.

BRIEF DESCRIPTION OF THE DRAWINGS

FIGS. 7A and 7B illustrate another example of the capacity component of the first embodiment;

FIG. 9 illustrates potentials of some nodes of the sense amplifier of the first embodiment over time;

FIG. 10 illustrates components and connections of a sense amplifier of a second embodiment;

FIG. 11 illustrates components and connections of a sense amplifier of a third embodiment;

FIG. 14 illustrates components and connections of a sense amplifier of a sixth embodiment;

FIG. 15 illustrates a second example of components and connections of the sense amplifier of the sixth embodiment;

FIG. 18 illustrates components and connections of a sense amplifier of an eighth embodiment; and FIG. 19 illustrates components and connections of a sense amplifier of the ninth embodiment.

DETAILED DESCRIPTION

According to one embodiment, a determination circuit includes a first inverter circuit. A second inverter circuit has a higher potential side node coupled to a higher potential side node of the first inverter circuit at a first node; a lower potential side node coupled to a lower potential side node of the first inverter circuit at a second node; includes an input coupled to an output of the first inverter circuit, a first bit line, and a first signal line; and includes an output coupled to an input of the first inverter circuit, a second bit line, and a second signal line. A first transistor turns on when receiving an asserted first signal. A first capacity component includes a first end which receives an inversion signal of the first signal. The first node is coupled to a first potential node, the first transistor is coupled between the second node and a second potential node having a lower potential than a potential of the first potential node, and a second end of the first capacity component is coupled to the second node. Alternatively, the second node is coupled to the second potential node, the first transistor is coupled between the first potential node and the first node, and the second end of the first capacity component is coupled to the first node.

Figure 1:
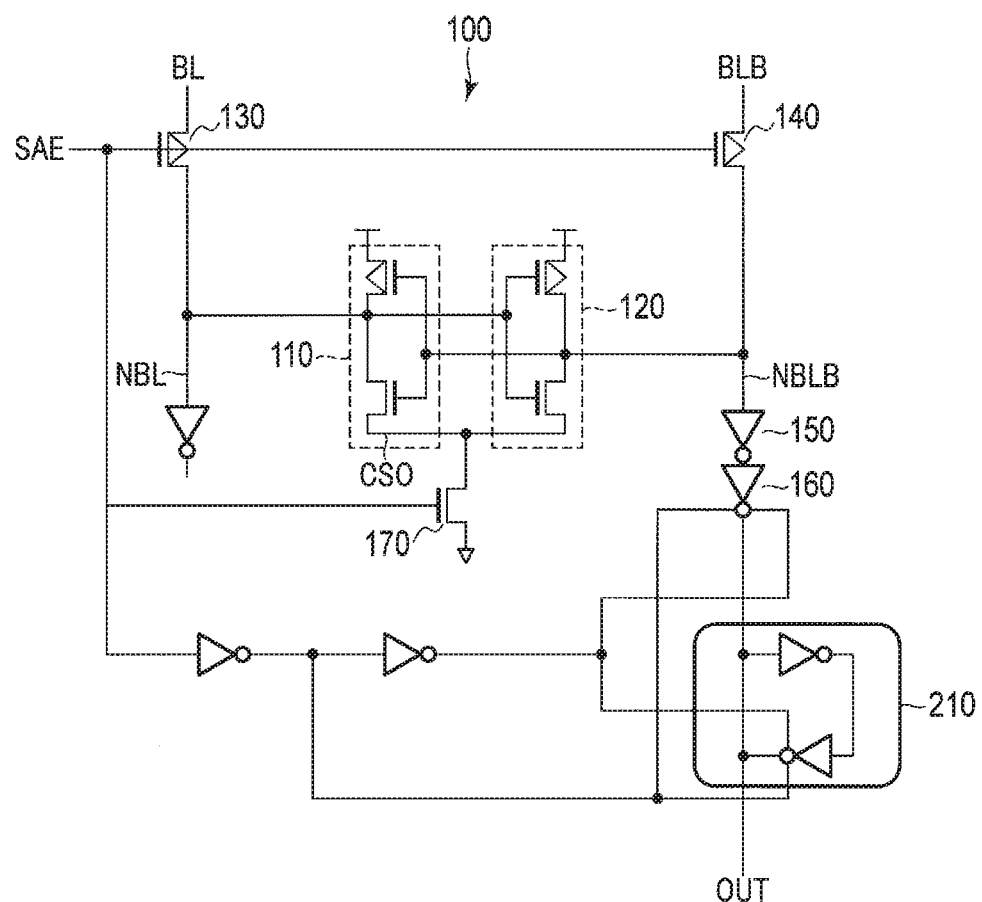
FIG. 1 illustrates components and connections of a sense amplifier for reference.

A determination circuit for determining the data of a memory cell which stores data with the combination of the potentials of two nodes, such as the one described above, includes a sense amplifier as shown in FIG. 1, for example.

As illustrated in FIG. 1, a sense amplifier 100 includes two CMOS inverter circuits 110 and 120. The inverter circuits 110 and 120 are coupled in parallel between a node of a power potential and a common node CSO. The common node CSO is grounded through a transistor 170. The gate of the transistor 170 receives a signal SAE.

The input of the inverter circuit 110 is coupled to the output of the inverter circuit 120 and a line NBLB, and the input of the inverter circuit 120 is coupled to the output of the inverter circuit 110 and a line NBL.

The line NBL is coupled to a bit line BL through a transistor 130. The line NBLB is coupled to a bit line BLB through a transistor 140, and outputs a signal OUT through inverter circuits 150 and 160, which are coupled in series. The bit lines BL and BLB make a pair, and are coupled to memory cells (not shown). The inverter circuit 160 is illustrated as including a transfer gate, i.e., the output of the inverter circuit 160 is coupled to the line of the signal OUT (to be referred to as a line OUT) through the transfer gate. The line OUT is coupled to a latch circuit 210.

As a result of read from a memory cell, one of the bit lines BL and BLB has a potential lower than a potential of the other in accordance with data stored in the memory cell. The sense amplifier 100 amplifies the difference of the potentials of the bit lines BL and BLB in order to determine which one of the potentials of the bit lines BL and BLB is larger. The amplified difference of potentials appears on the nodes NBL and NBLB.

Figure 2:
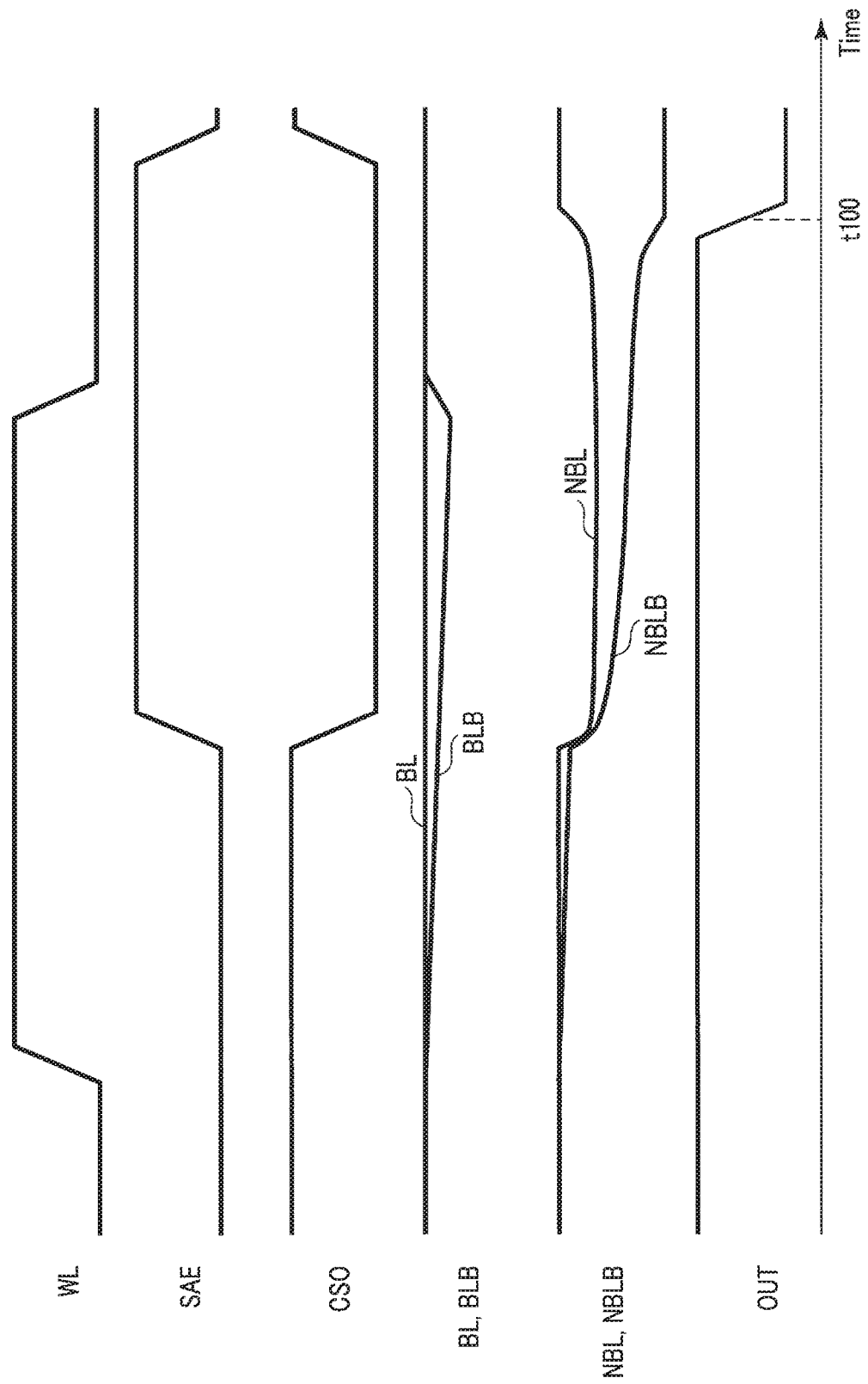
FIG. 2 illustrates potentials of some nodes of the sense amplifier of FIG. 1 over time.

The FIG. 1 sense amplifier operates as shown in FIG. 2. The nodes NBL and NBLB are precharged to be high and coupled to the bit lines BL and BLB which are coupled to a read-target memory cell. FIG. 2 illustrates an example with the bit line BL having the higher potential. When the word line WL coupled to the read-target memory cell transitions to high, the potentials of the bit lines BL and BLB decrease at different speeds, and the potentials of the nodes NBL and NBLB follow the bit lines BL and BLB.

Then, when the signal SAE transitions to high, the sense amplifier 100 starts a sense. The sense accelerates the fall of the potentials of the nodes NBL and NBLB. When the lower one of the potentials of the lines NBL and NBLB decreases to a magnitude sufficient as the low level of a digital signal, the state of the signal OUT settles. Specifically, in an example with the bit line BLB having the lower potential as in the ongoing example, when the potential of the line NBLB decreases to be low enough to be determined as the low level input by the inverter circuit 150, the output signal OUT of the inverter circuit 150 transitions to low from high (time t100). This low-level signal OUT is treated as a signal as a result of the determined sense.

It takes time for the potential of the lower one of the potentials of the lines NBL and NBLB to decrease sufficiently to allow the result of the sense to be determined. This time is a time necessary until the potential difference of the lines NBL and NBLB becomes large enough.

On the other hand, the power voltages of memory devices keep decreasing, which reduces the consumption current thereof. With the decrease in the power voltage, as a result of the read from a memory cell the resultant potential of the larger one of the potentials on the bit lines BL and BLB keeps decreasing. This leads to a long time necessary for the difference of the potentials of the bit lines BL and BLB, and by extension the difference of the potentials of the lines NBL and NBLB to be formed. Furthermore, this results in a longer time necessary for the result of the sense to be determined.

Similarly, when the memory devices is in an environment of low temperature (for example, −40° C.), it takes a long time for the result of the sense to be determined, for example. This is because the potentials of nodes of the memory devices change slowly in a low temperature environment.

For a reduced time for determination of the sense result, the difference of the potentials of the bit lines BL and BLB can be increased. However, increasing the potential difference of the bit lines BL and BLB requires increased amplitudes of the potentials of the bit lines BL and BLB. This in turn increases the current consumed by the memory devices, which is contrary to a request for a reduced consumed current of the memory devices.

Embodiments will now be described with reference to figures. In the following description, components with substantially the same functionalities and configurations will be referred to with the same reference numerals, and repeated descriptions are omitted. The entire description for a particular embodiment also applies to another embodiment unless stated otherwise. Each embodiment illustrates the device and method for materializing the technical idea of this embodiment, and the technical idea of an embodiment does not specify the quality of the material, form, structure, arrangement of components, etc. to the following.

First Embodiment

Figure 3:
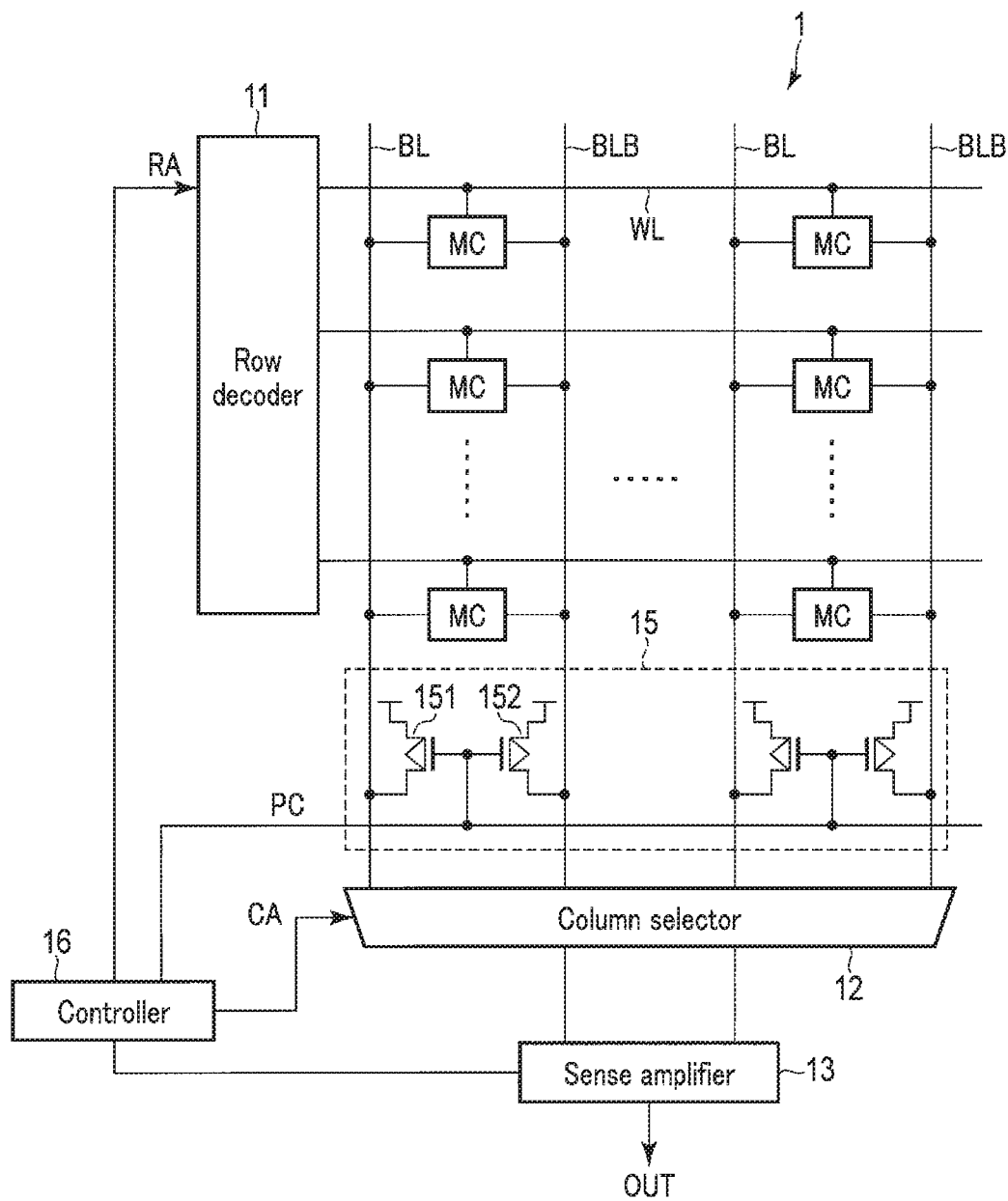
FIG. 3 illustrates components and connections of a semiconductor memory device of a first embodiment.

FIG. 3 illustrates components and connections of a semiconductor memory device according to a first embodiment. As illustrated in FIG. 3, the memory device 1 includes plural memory cells MC, plural word lines WL, plural pairs of bit lines BL and BLB, a row decoder 11, a column selector 12, a sense amplifier (determination circuit) 13, a precharge circuit 15, and a controller 16.

The memory cells MC store data and are arranged in a matrix. Each memory cell MC includes two memory nodes, and can store one-bit data based on which one of the potentials of the two memory nodes is higher than the other. The memory cells MC are those of a static random access memory (SRAM), for example.

Each row is provided with one word line WL. Each column is provided with one pair of bit lines BL and BLB.

The word lines WL are coupled to the row decoder 11. The row decoder 11 selects one word line WL based on a row address signal RA. The row address signal RA is generated from an address signal, which is supplied from a controller outside the memory device 1.

The bit lines BL and BLB are coupled to the column selector 12. The column selector 12 couples one pair of bit lines BL and BLB to the sense amplifier 13 based on a column address signal CA. The sense amplifier 13 determines data stored in a read-target memory cell MC. Specifically, the sense amplifier 13 amplifies the difference of the potentials of bit lines BL and BLB coupled thereto, and outputs a signal OUT based on the result of the amplification. The signal OUT is stored as data in the read-target memory cell MC.

One sense amplifier 13 may be coupled to each memory cell MC. In this case, the column selector 12 is unnecessary. Alternatively, one sense amplifier 13 may be disposed for two or more columns. In this case, one column selector 12 is disposed for plural columns which share a sense amplifier 13, and the column selector 12 couples the bit lines BL and BLB of the selected column to the sense amplifier 13.

The bit lines BL and BLB are also coupled to the precharge circuit 15. The precharge circuit 15 precharges the bit lines BL and BLB to particular precharge potentials before read of the data from a memory cell MC. The precharge potential is, for example, a power potential (VDD), which is the potential of the power supplied to the memory device 1. The precharge circuit 15 includes two p-type metal oxide semiconductor field effect transistors (MOSFETs) 151 and 152 in each column. The transistor 151 is coupled between the node of the precharge potential and a bit line BL. The transistor 152 is coupled between the node of the precharge potential and a bit line BLB. The gates of the transistors 151 and 152 receive a signal PC from the controller 16.

The controller 16 controls the whole operation of the memory device 1, and controls the row decoder 11, the column selector 12, the sense amplifier 13, and the precharge circuit 15.

Figure 4:
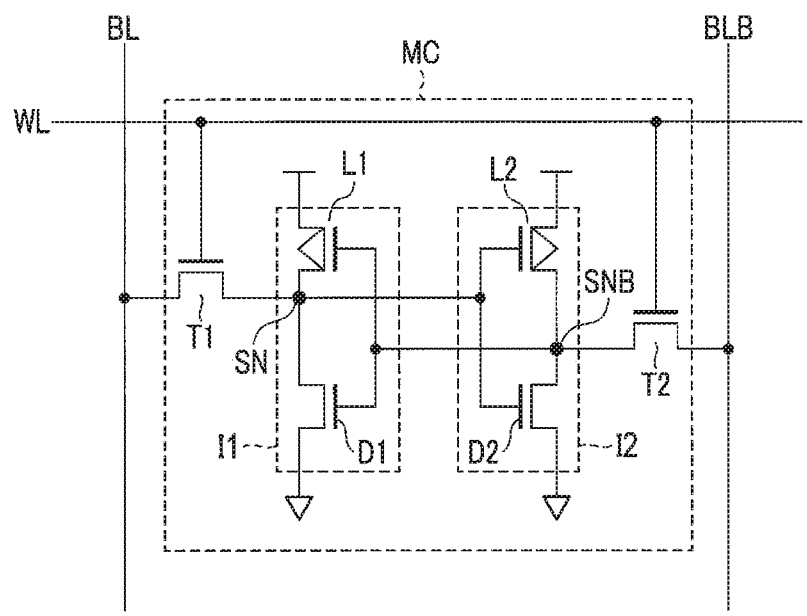
FIG. 4 illustrates components and connections of a memory cell of the first embodiment.

Each memory cell MC has components and connections illustrated in FIG. 4, for example. As illustrated in FIG. 4, the memory cell MC includes two CMOS inverter circuits I1 and I2, and one pair of transfer transistors T1 and T2. The two CMOS inverter circuits I1 and I2 are coupled in a so-called cross-coupled manner to make a flip-flop. Specifically, the input of the CMOS inverter circuit I1 is coupled to the output of the CMOS inverter circuit I2, and the output of the CMOS inverter circuit I1 is coupled to the input of the CMOS inverter circuit I2.

The inverter circuit I1 includes a load L1 and a drive transistor D1, which are coupled in series between the node of the power potential and the node of the ground potential (VSS), or ground. The load L1 is located at the power potential side, and the drive transistor D1 is located at the ground potential side. The inverter circuit I2 includes a load L2 and a drive transistor D2, which are coupled in series between the power potential node and the ground potential node. The load L2 is located at the power potential side, and the drive transistor D2 is located at the ground potential side.

Each of the loads L1 and L2 is a resistance element or a p-type MOSFET, for example. The transistors D1, D2, T1, and T2 are n-type MOSFETs, for example.

A node SN at which the load L1 and the transistor D1 are coupled, and a node SNB at which the load L2 and the transistor D2 are coupled, serve as memory nodes and store potentials for data. The node SN is coupled to the bit line BL through a transistor T1, and the node SNB is coupled to the bit line BLB through a transistor T2. The gates of the transistors T1 and T2 are coupled to one word line WL. A selected word line WL is made high by the row decoder 11, and the transistors T1 and T2 coupled to the selected word line WL turn on.

The memory cell MC stores data with the potential of the node SN and the potential of the node SNB, and stores one-bit data based on which one of the potentials of the nodes SN and SNB is higher than the potential of the other.

Figure 5:
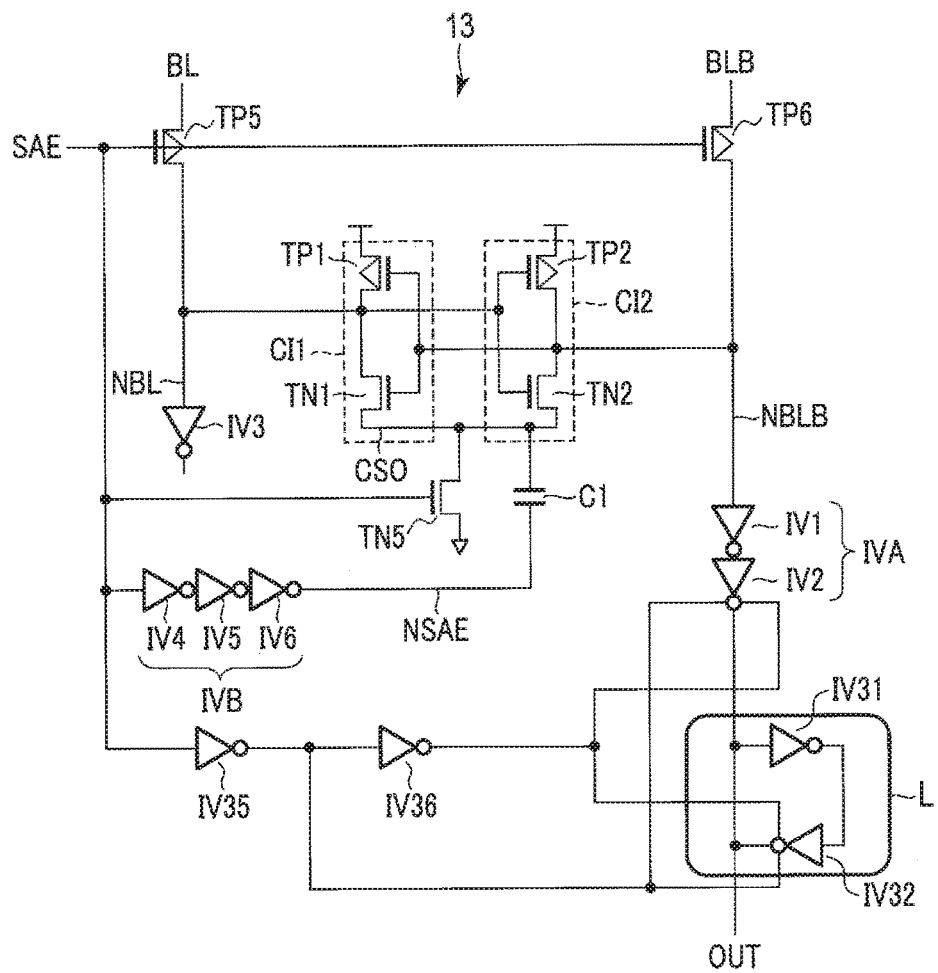
FIG. 5 illustrates components and connections of a sense amplifier of the first embodiment.

The sense amplifier 13 has components and connections illustrated in FIG. 5. FIG. 5 illustrates components and connections of the sense amplifier of the first embodiment. As illustrated in FIG. 5, the sense amplifier 13 is coupled between the power potential node and a node CSO.

The sense amplifier 13 includes two CMOS inverter circuits CI1 and CI2. The inverter circuits CI1 and CI2 are cross-coupled to make a flip flop.

The inverter circuit CI1 includes a p-type MOSFET TP1 and an n-type MOSFET TN1, which are coupled in series. The source of the transistor TP1 serves as the node at the higher potential side of the inverter circuit CI1, and is coupled to the node of the power potential. The inverter circuit CI2 includes a p-type MOSFET TP2 and an n-type MOSFET TN2, which are coupled in series. The source of the transistor TP2 serves as the node at the higher potential side of the inverter circuit CI2, and is coupled to the node of the power potential. The transistors TP1 and TP2 may be resistance elements.

The source of the transistor TN1 and the source of the transistor TN2 are coupled. The node at which the transistor TN1 and the transistor TN2 are coupled is hereinafter referred to as a common source node CSO. The node CSO serves as a node at the lower potential side of the inverter circuits CI1 and CI2, and is grounded through an n-type MOSFET TN5.

The node at which the transistors TP1 and TN1 are coupled is coupled to the line NBL. The line NBL is coupled to the input of the inverter circuit IV3. The inverter circuit IV3 can be any given logic circuit which inverts the logic, and is not limited to an inverter circuit. Any below-mentioned inverter circuit can be any logic inverter similarly.

The node at which the transistors TP2 and TN2 are coupled is coupled to the line NBLB. The lines NBL and NBLB are coupled to one pair of bit lines BL and BLB via p-type MOSFETs TP5 and TP6. Specifically, the line NBL is coupled to the bit line BL of one pair of bit lines through the transistor TP5, and the line NBLB is coupled to the bit line BLB of the pair of bit lines through the transistor TP6.

The lines NBL and NBLB are the inputs of the sense amplifier 13, and are also the output thereof.

The line NBLB is also coupled to the input of an inverter circuit IV1, which is at the first stage of a set of even (for example, two) serially-coupled inverter circuits IVA. An inverter circuit IV2, which is at the last stage of the inverter circuit set IVA, outputs a signal OUT. The inverter circuit IV2 at the last stage is illustrated as including a transfer gate, i.e., the output of the inverter circuit IV2 is coupled to a line of the signal OUT (referred to as a line OUT, hereinafter) through the transfer gate. The transfer gate includes an n-type MOSFET and a p-type MOSSFET coupled in parallel, for example.

The line OUT is coupled to a latch circuit L. The latch circuit L includes inverter circuits IV31 and IV32 coupled in series. The input of the inverter circuit IV31 is coupled to the line OUT. The inverter circuit IV32 is illustrated as including a transfer gate, i.e., the output of the inverter circuit IV32 is coupled to the line OUT through the transfer gate.

The gates of the transistors TP5 and TP6 are coupled to a line SAE. The line SAE is also coupled to the gate of transistor TN5. The line SAE transmits a sense amplifier enable signal from the controller 16. The signal on the line SAE may be referred to as a sense amplifier enable signal SAE, hereinafter. The sense amplifier enable signal SAE controls enabling or disabling of the sense amplifier 13.

The line SAE is also coupled to the input of an inverter circuit IV4, which is at the first stage of a set of odd (for example, one or more) serially-coupled inverter circuits IVB. Therefore, the output NSAE of the inverter circuit IV6, which is at the last stage of the inverter circuits IVB, has the inverted logic of the sense amplifier enable signal SAE. The reason why the inverter circuit set IVB includes not one but three or more inverter circuits is to delay change of the signal on the line SAE to output the same on the node NSAE.

The line SAE is further coupled to the input of an inverter circuit IV35. The output of the inverter circuit IV35 is coupled to the input of an inverter circuit IV36. The outputs of the inverter circuits IV35 and IV36 are coupled to the gates of MOSFET of the transfer gates of the inverter circuits IV2 and IV32, and control turning on or off of the transfer gates.

The node NSAE is capacity-coupled to the node CSO, i.e., the node NSAE is coupled to the node CSO through a capacity component C1. The capacity component C1 can be implemented with various components. Examples will be described with reference to FIG. 6.

Figure 6:
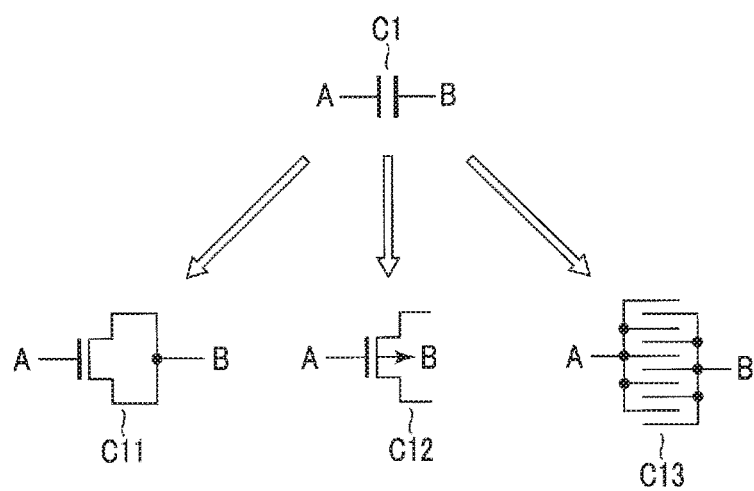
FIG. 6 illustrates an example of a capacity component of the first embodiment.

FIG. 6 illustrates examples of the capacity component C1 of the first embodiment. A capacity component C1 including terminals (or, nodes) A and B can be implemented with various forms, such as capacity components C11, C12, and C13. The capacity component C11 is a MOSFET with the gate serving as the terminal A and a source and/or a drain serving as the terminal B. The capacity between the gate and the source and/or drain is used. The MOSFET may be of a p-type or n-type.

The capacity component C12 is a MOSFET with the gate serving as the terminal A and the back gate (or, a well, a substrate, or bulk) serving as the terminal B. The capacity between the gate and the back gate is used. The well and the substrate are where the MOSFET is disposed. The MOSFET may be of a p-type or n-type. In addition, in the capacity element C12, the capacity between the gate and the source (or drain) may be used, as is done in the capacity component C11.

The capacity component C13 is a set of two separate interconnects and an insulator therebetween. One of the interconnects serves as the terminal A and the other serves as the terminal B. The capacity can be increased by increasing the area over which the two interconnects face through the insulator. To this end, the interconnects branch off. The branch sections face each other along the direction over which a substrate as a base of the memory device 1 spreads, and/or face along the direction which intersects the substrate. FIGS. 7A, 7B, 8A, and 8B illustrate specific examples of the capacity component C13. FIG. 7B illustrates the cross section along VIIB-VIIB of FIG. 7A. FIG. 8B illustrates the cross section along VIIIB-VIIIB of FIG. 8A.

As illustrated in FIGS. 7A and 7B, the node A is implemented by an interconnect LA in a layer M1 above the substrate sub, which serves as the base for the memory device 1. In a layer M2 above the layer M1, an interconnect LB is disposed along the interconnect LA. An insulator (not shown) is located between the interconnects LA and LB. The node B is implemented by the interconnect LB. The reference numeral AA indicates an active area, and reference numeral CS indicates a contact plug.

Figure 8A:
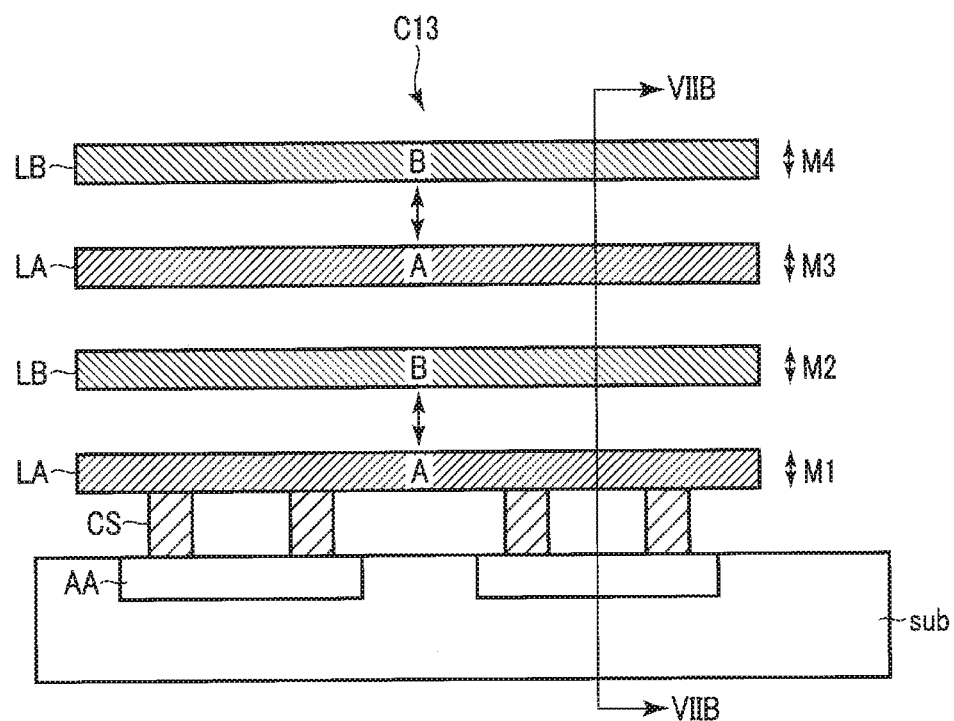
FIGS. 8A and 8B illustrate still another example of the capacity component of the first embodiment.
Figure 8B:
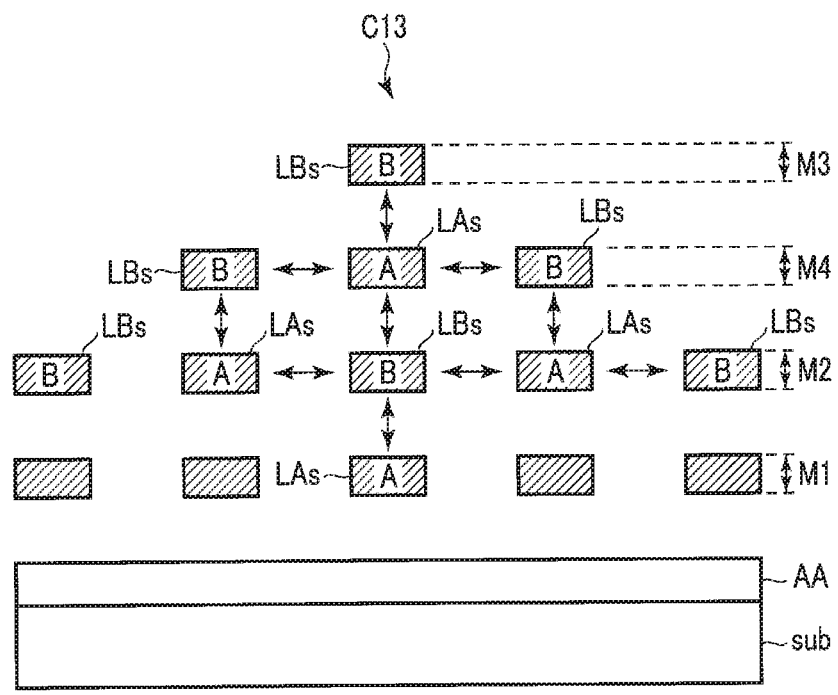

As illustrated in FIGS. 8A and 8B, the interconnects LA and LB may branch off and branches LAs for the interconnects LA and branches LBs for the interconnects LB may be lined up alternately along the surface of the substrate sub. Additional branches LAs and LBs may be disposed also in a layer M3 above the layer M2, and a layer M4 above the layer M3. In addition, the branches LAs and LBs on different layers may be located to face each other in a direction which intersects the substrate sub.

Referring to FIG. 9, operation of the sense amplifier 13 will now be described. FIG. 9 illustrates potentials of some nodes of the memory device of the first embodiment over time. At the start of the FIG. 9 operation, the bit lines BL and BLB coupled to the read-target memory cell MC are selected by the column selector 12, i.e., they are in the state where they can be coupled to the sense amplifier 13. Moreover, the enable signal SAE is low at the start of the FIG. 9 operation. For this reason, the transistors TP5 and TP6 are on, and, therefore, the line NBL is electrically coupled to the selected bit line BL and the line NBLB is electrically coupled to the selected bit line BLB.

Moreover, the bit lines BL and BLB are precharged by the precharge circuit 15 to be at a precharge potential (the power potential VDD) at the start of the FIG. 9 operation. Therefore, the potential on the line NBL, which may be referred to as the potential NBL (also applicable to others similarly) and the potential NBLB are at the potential VDD, i.e., they have a magnitude which is determined as the high level of a digital signal. As a result, the signal OUT is high. Furthermore, with the low signal SAE, the potential of the output NSAE, which may be referred to as a signal NSAE (also applicable to others similarly), is high.

At a time t0, the row decoder 11 makes high the word line WL coupled to the read-target memory cell MC. As a result, the read-target memory cell MC is coupled to the bit lines BL and BLB. With this, transfer of the potentials of the memory nodes SN and SNB of the memory cell MC (see FIG. 4) to the bit lines BL and BLB is started, and one of the potentials of the bit lines BL and BLB falls based on the data stored in the memory cell MC. FIG. 9 is based on an example in which the potential of the bit line BLB falls. Both the potentials NBL and NBLB are high, and, therefore, the flip flop made of the inverter circuits CI1 and CI2 is in an indefinite state.

When one of the potentials of the bit lines BL and BLB fully falls, the controller 16 makes the signal SAE high to enable the sense amplifier 13 at a time t1. The transition of the signal SAE to high uncouples the line NBL from the bit line BL, and line NBLB from the bit line BLB. Moreover, the transition of the signal SAE to high grounds the node CSO through the transistor TN5, which has been turned on. As a result, the sense amplifier 13 is now coupled between the power potential node and the ground potential node, and starts a sense. The sense amplifier 13 operates as the potentials of nodes vary as follows.

At the start of the sense, the potentials NBL and NBLB have particular potentials higher than the ground potential, and, therefore, the transistors TN1 and TN2 are on. For this reason, both the potentials NBL and NBLB go to the ground potential through transistors TN2 and TN1, respectively. However, the potential NBL is higher than the potential NBLB, and, therefore, the transistor TN2 is on more strongly than the transistor TN1. For this reason, the current flowing through the transistor TN2 is larger than the current flowing through the transistor TN1, and, therefore, the potential NBLB is pulled to the ground potential more strongly than the potential NBL. The transition of the potentials NBL and NBLB to the ground potential progresses further, and when the potential NBLB falls enough to turn on the transistor TP1, the transistor TP1 turns on. As a result, the potential NBL goes to the power potential through the transistor TP1. In this way, the potential NBL becomes the power potential and the potential NBLB becomes the ground potential, thereby the inverters CI1 and C2 become stable. With such a mechanism, the sense amplifier 13 pulls down the lower one of the potentials NBL and NBLB toward the ground potential, and pulls up the higher one toward the power potential. Therefore, the difference between the signals NBL and NBLB starts to expand from the time t1.

Furthermore, the transition of the signal SAE to high brings the potential NSAE to low at a time t2, which comes after the lapse of a particular time from the time t1. The interval between the times t1 and t2 depends on the number of the inverter circuits in the inverter circuit set IVB. The transition of the potential NSAE to low is transmitted to the node CSO through the capacity component C1. Specifically, the potential of the node CSO (potential CSO) falls over a temporary period until the time t3.

The fall of the potential CSO pulls down the potentials of the sources of the transistors TN1 and TN2 further to increase the currents flowing through the transistors TN1 and TN2. As a result, the lower one of the potentials NBL and NBLB (i.e., NBLB) goes to the ground potential quickly, and the inverters CI1 and CI2 become stable quickly. Specifically, the fall of the potential CSO accelerates the operation of the sense amplifier 13 going toward the stable state (steady state) to accelerate the expansion of the difference between the potentials NBL and NBLB. In particular, the inclination of the fall of potential NBLB is large. This results in an accelerated sense.

When the potential NBLB falls to be a magnitude small enough as the low level of a digital signal, the signal OUT is settled at the time t4. Specifically, when the potential NBLB falls to be a magnitude small enough to be determined as the low level by the inverter circuit IV1, the output OUT transitions to low from high.

The potential NBLB keeps falling even after the determination of the sense result at the time t4, and the inverter circuits CI1 and CI2 become stable at a time t5. As a result, the potential NBL is now the power potential and the potential NBLB is now the ground potential. Then, at a time t6, the controller 16 makes the signal SAE low to complete the sense.

As described, in the first embodiment, the node CSO coupled to the ground potential node is coupled to the transistor TN5, which controls enabling of the sense amplifier 13, and to the node NSAE through the capacity component C1, and the potential of the node NSAE falls after the start of the operation of the sense amplifier 13. For this reason, the potential of the node CSO is further pulled down in the negative direction from the ground potential reached after the start of the sense by the sense amplifier 13. For this reason, larger currents flow through the inverter circuits CI1 and CI2, and the potential of a node which is at the ground potential in the steady state (for example, the line NBLB) is pulled down to the ground potential more quickly than would be pulled down to the ground potential through the transistor TN5 without the capacity component C1. This facilitates the transition of the sense amplifier 13 to the steady state, i.e., it can enhance the capability of the sense amplifier 13 for bringing two potentials indefinite at the start of the sense (the potentials NBL and NBLB) into the steady state. Specifically, the sense amplifier 13 pulls up one of the potentials NBL and NBLB to the power potential quickly, and pulls down the other to the ground potential quickly. Therefore, the output by the sense amplifier 13 settles quickly, and the operation speed of the sense amplifier 13 improves.

The reduction of the time for the output of the sense amplifier 13 to settle because of the node CSO capacity-coupled to a node falling after the sense starts can be easily seen from the comparison of FIGS. 9 and 2. Specifically, the fall of the potential of the node CSO at the time t3 facilitates the fall of the potential NBLB, and, as a result, the time t4, at which the output by the sense amplifier 13 settles, comes much earlier than time t100, at which the output of the sense amplifier 100 settles in FIG. 9.

Alternatively, when the sense amplifier 13 is designed to require a longer time than the time for settlement of the output in FIG. 9 (for example, the same time as that in FIG. 2), the memory device 1 can operate with lower consumption current. In other words, the facilitation of fall of the potential of the node CSO allows the sense amplifier 13 to quickly enter a state with output thereof settled even with a small difference of the potentials of the bit lines BL and BLB. Therefore, the potentials read from the memory cells MC and the precharge potential can be low, which can suppress the current consumed by the memory device 1. For example, when the sense amplifier 13 is designed to require the same time for settlement of the output thereof as that in FIG. 2, the memory device 1 consumes a smaller current than a memory device including the sense amplifier of FIG. 2.

Second Embodiment

The second embodiment differs from the first embodiment in the structure of the sense amplifier, and the common source node is located at the higher potential side of the inverter circuits CI1 and CI2.

FIG. 10 illustrates components and connections of a sense amplifier of the second embodiment. As illustrated in FIG. 10, the inverter circuits CI1 and CI2 are coupled in parallel between a common source node CSO2 and the ground potential node instead of between the power potential node and the common source node CSO in the first embodiment (FIG. 5). Specifically, the source of the transistor TP1 and the source of the transistor TP2 are coupled to each other at the common source node CSO2, whereas the source of the transistor TN1 and the source of the transistor TN2 are grounded.

The common source node CSO2 is coupled to the power potential node through a transistor TP11.

The line NBL is coupled to the bit line BL through an n-type MOSFET TN11 instead of the transistor TP5 in the first embodiment. The line NBLB is coupled to the bit line BLB through an n-type MOSFET TN12 instead of the transistor TP6 in the first embodiment. The transistors TN11 and TN12 are coupled to a line/SAE at the gates thereof. The line /SAE transmits a sense amplifier enable signal/SAE. The sign "/" at the beginning of a particular signal name indicates the negative logic of this signal throughout the specification. Therefore, the signal/SAE is asserted at the low level, and the asserted signal/SAE enables the sense amplifier 13.

The line/SAE is also coupled to the gate of the transistor TP11. The line/SAE is further coupled to an inverter circuit IV7, which is at the first stage of a set of inverter circuits IVC. The inverter circuit set IVC includes odd inverter circuits (for example, three). The output NSAE2 of an inverter circuit IV9, which is at the last stage of the inverter circuit set IVC, is coupled to the node CSO2 through a capacity component C2. The capacity component C2 has the same features as the capacity component C1, and the description in the specification for the capacity component C1 applies to the capacity component C2.

In FIG. 10, the latch circuit L and the inverter circuits IV35 and IV36 are omitted.

The operation is the same as that of the first embodiment. Specifically, in the first embodiment, the difference of the two potentials at the both ends of the inverter circuits CI1 and CI2 is expanded by lowering the lower one of the two potentials. In contrast, in the second embodiment, the difference of the two potentials at the both ends of the inverter circuits CI1 and CI2 is expanded by raising the higher one of the two potentials. More specifically, the signal/SAE is made low to enable the sense amplifier 13, and this transition to low is transmitted through the inverter circuit set IVC to the node CSO2 as a transition to high.

As described, in the second embodiment, the node CSO2 coupled to the power potential node is coupled to the transistor TP11, which controls enabling of the sense amplifier 13, and to the node NSAE2 through the capacity component C2, and the potential of the node NSAE2 rises after the start of the operation of the sense amplifier 13. For this reason, the potential of the node CSO2 rises, and the difference between the potential of the node of the sense amplifier 13 coupled to the power potential node and the potential of the node of the same coupled to the ground potential node expands after the start of the operation of the sense amplifier 13 as in the first embodiment. This produces the same advantages as those of the first embodiment.

Third Embodiment

The third embodiment is a combination of the first and second embodiments.

FIG. 11 illustrates components and connections of a sense amplifier of the third embodiment, and is based on FIG. 5 (first embodiment). As illustrated in FIG. 11, the inverter circuits CI1 and CI2 are coupled in parallel between the common source node CSO2 and the common source node CSO instead of between the power potential node and the common source node CSO in the first embodiment. Specifically, the source of the transistor TP1 and the source of the transistor TP2 are coupled to each other at the node CSO2. The node CSO2 is coupled to the power potential node through the transistor TP11. Only one of the transistors TN5 and TP11 may be disposed.

The signal SAE is received by an inverter circuit IV11, which is at the first stage of a set of even serially-coupled inverter circuits IVD. The output NSAE3 of an inverter circuit IV12, which is at the last stage of the inverter circuit set IVD, is coupled to the common source node CSO2 through the capacity component C2.

In order for the inversion signal/SAE of the signal SAE to be supplied to the gate of the transistor TP11, the output of the inverter circuit IV11 is coupled to the gate of the transistor TP11.

In FIG. 11, the latch circuit L and the inverter circuits IV35 and IV36 are omitted.

According to the sense amplifier of the third embodiment, the node CSO2 is coupled to the node NSAE3 through the capacity component C2 as in the second embodiment, and the node CSO is coupled to the node NSAE through the capacity component C1 as in the first embodiment. With this, the potential of the node NSAE3 rises after the start of the operation of the sense amplifier 13, and the potential of the node NSAE falls after the start of the operation of the sense amplifier 13. This can produce the advantages of the first and second embodiments, i.e., the sense amplifier 13 operates more quickly than in the first or second embodiment. Alternatively, the sense amplifier 13 consumes less current than in the first or second embodiment.

Fourth Embodiment

The fourth embodiment differs from the first embodiment in the structure of the sense amplifier.

Figure 12:
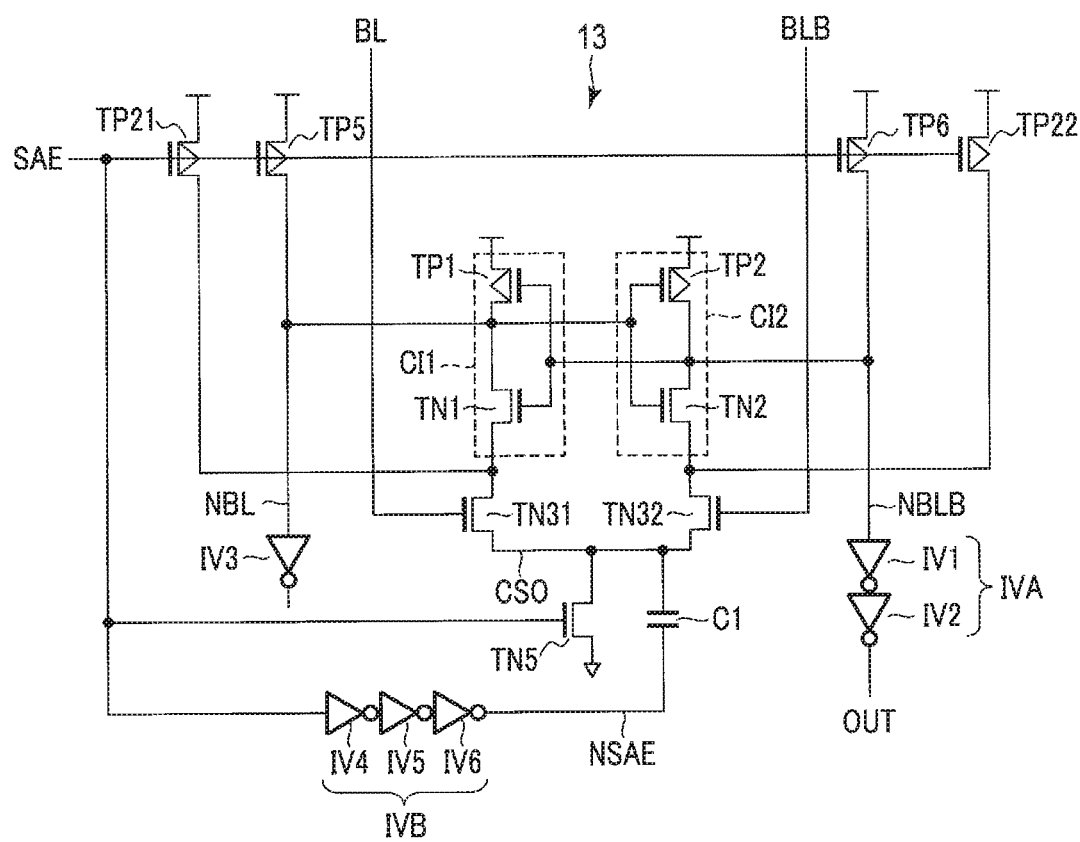
FIG. 12 illustrates components and connections of a sense amplifier of a fourth embodiment.

FIG. 12 illustrates components and connections of a sense amplifier of the fourth embodiment, and is based on FIG. 5 (first embodiment). As illustrated in FIG. 12, inverter circuit CI1 is coupled to the common source node CSO through an n-type MOSFET TN31, and the inverter circuit CI2 is coupled to the node CSO through an n-type MOSFET TN32. The gate of the transistor TN31 is coupled to the bit line BL (or, coupled to the bit line BL of a column selected through the column selector 12). The gate of the transistor TN32 is coupled to the bit line BLB (or, coupled to the bit line BLB of the column selected through the column selector 12).

In contrast, the line NBL is coupled to the power potential node through the transistor TP5 instead of the bit line BL as in FIG. 5. The line NBLB is coupled to the power potential node through the transistor TP6 instead of to the bit line BLB as in FIG. 5. Therefore, the inputs and outputs of the sense amplifier 13 are separate, the bit lines BL and BLB are the inputs of the sense amplifier 13, and the lines NBL and NBLB are the outputs of the sense amplifier 13.

The sense amplifier 13 of the fourth embodiment further includes p-type MOSFETs TP21 and TP22. The transistor TP21 is coupled at the source to the power potential node, and at the drain to the connection node of the transistors TN1 and TN31. The transistor TP22 is coupled at the source to the power potential node, and at the drain to the connection node of the transistors TN2 and TN32. Respective gates of the transistors TP21 and TP22 are coupled to the line SAE.

In FIG. 12, the latch circuit L and the inverter circuits IV35 and IV36 are omitted.

Also with the sense amplifier of FIG. 12, the higher one of the potentials of the bit lines BL and BLB is amplified toward the power potential and appears on the line NBL, and the lower one is amplified toward the ground potential and appears on the line NBLB.

As described, the node CSO coupled to the ground potential node is coupled to the node NSAE through the capacity component C1, and the potential of the node NSAE falls after the start of the operation of the sense amplifier 13, as in the first embodiment. For this reason, the difference between the potential of the node of the sense amplifier 13 coupled to the power potential node and the potential of the node of the same coupled to the ground potential node expands after the start of the operation of the sense amplifier 13, as in the first embodiment. This produces the same advantages as that of the first embodiment.

Fifth Embodiment

The fifth embodiment differs from the fourth embodiment in the structure of the sense amplifier, and the common source node is located at the higher potential side of the inverter circuits CI1 and CI2.

Figure 13:
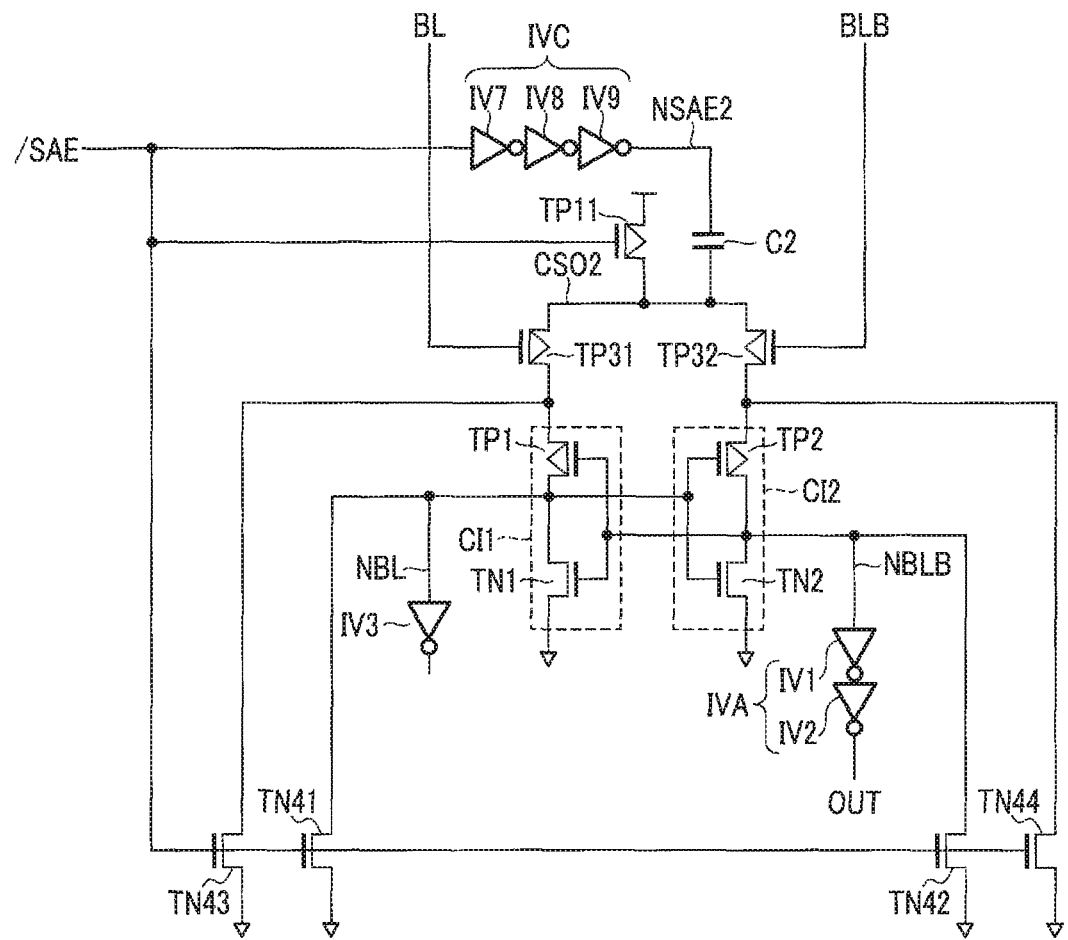
FIG. 13 illustrates components and connections of a sense amplifier of a fifth embodiment.

FIG. 13 illustrates components and connections of a sense amplifier of the fifth embodiment. As illustrated in FIG. 13, the inverter circuits CI1 and CI2 are coupled in parallel between the common source node CSO2 and the ground potential node through p-type MOSFETs TP31 and TP32 instead of between the power potential node and the common source node CSO in the fourth embodiment (FIG. 12). Specifically, the source of the transistor TP1 is coupled to the node CSO2 through the transistor TP31, and the source of the transistor TP2 is coupled to the node CSO2 through the transistor TP32. In contrast, the source of the transistor TN1 and the source of the transistor TN2 are grounded.

The node CSO2 is coupled to the power potential node through the transistor TP11 as in the second embodiment (FIG. 10). The node CSO2 is also coupled to the output NSAE2 of an inverter circuit IV9 at the last stage of a set of inverter circuits IVC through the capacity component C2 as in the second embodiment. An inverter circuit IV7 at the first stage of the inverter circuit set IVC is coupled to the line/SAE.

The line NBL is grounded through an n-type MOSFET TN41 instead of coupled to the power potential node through the transistor TP5 in FIG. 12. The line NBLB is grounded through an n-type MOSFET TN42 instead of coupled to the power potential node through the transistor TP6 in FIG. 12. Respective gates of the transistors TN41 and TN42 are coupled to the line/SAE.

The connection node between the transistors TP1 and TP31 is grounded through an n-type MOSFET TN43. The connection node between the transistors TP2 and TP32 is grounded through an n-type MOSFET TN44. Respective gates of the transistors TN43 and TN44 are coupled to the line/SAE.

In FIG. 13, the latch circuit L and the inverter circuit IV35 and IV36 are omitted.

The operation is similar to that of the fourth embodiment, and the relationship between the fifth and fourth embodiments is similar to the relationship between the second and first embodiments, i.e., which one of the lower potential side common node CSO and the higher potential side common node CSO2 is used. Based on this, the description of the second embodiment applies to the fifth embodiment. Specifically, in the fifth embodiment, the difference between the two potentials of the both ends of the inverter circuits CI1 and CI2 is expanded by raising the higher one of the two potentials. More specifically, the transition of the signal/SAE to low is transmitted to the node CSO2 as a high level transition through the inverter circuit set IVC.

As described, in the fifth embodiment, the node CSO2 coupled to the power potential node is coupled to the node NSAE2 through the capacity component C2, and the potential of the node NSAE2 rises after the start of the operation of the sense amplifier 13. For this reason, the difference between the potential of the node of the sense amplifier 13 coupled to the power potential node and the potential of the node of the same coupled to the ground potential node expands after the start of the operation of the sense amplifier 13, as in the first embodiment. This produces the same advantages as those of the first embodiment.

The fifth embodiment can be combined with the fourth embodiment in the same way as the second embodiment can be combined with the first embodiment. The combination of the fourth and the fifth embodiments further enables the sense amplifier 13 to operate better than in the case of solely the fourth or fifth embodiment.

Sixth Embodiment

The sixth embodiment differs from the first to fifth embodiments in where the line SAE is capacity-coupled.

FIG. 14 illustrates components and connections of a sense amplifier of the sixth embodiment, and is based on FIG. 5 (first embodiment). As illustrated in FIG. 14, the output NSAE of the inverter circuit IV6 at the last stage of the inverter circuit set IVB is coupled to the input of an inverter circuit IV21. The potential of the output NSAE3 of the inverter circuit IV21 has the same logic as the signal SAE, and is coupled through a capacity component C3 to the back gate (well, substrate, or bulk) NB of each of the transistors TN1 and TN2, i.e., the same area as the channel of the transistors TN1 and TN2. The transistors TN1 and TN2 are disposed in the same p-well, which is also referred to as the back gate NB. The capacity component C3 has the same features as the capacity component C1, and the description in the specification for the capacity component C1 also applies to the capacity component C3.

When the signal SAE is made high in order to enable the sense amplifier 13, the potentials of the back gates NB of the transistors TN1 and TN2 rise by capacity coupling. Such application of the voltage to the back gates is referred to as a forward bias or substrate bias effect. The forward bias decreases the differences between the potentials of the gates of the transistors TN1 and TN2 and the potential of the back gates, and decreases effective threshold voltages of the transistors TN1 and TN2. For this reason, the transistors TN1 and TN2 turn on with smaller gate voltages than without the forward bias, or send, with particular gate voltages, larger current than without the forward bias. This assists the operation of the inverter circuits CI1 and CI2, and by extension the operation of the sense amplifier 13, and facilitates the operation of the sense amplifier 13 going to the steady state.

In FIG. 14, the latch circuit L and the inverter circuit IV35 and IV36 are omitted.

Alternatively to or in addition to the forward bias of the transistors TN1 and TN2, the forward bias may be applied to the transistors TP1 and TP2. FIG. 15 illustrates a second example of components and connections of the sense amplifier of the sixth embodiment, and illustrates the example of the forward bias to both set of the transistors TN1 and TN2 and set of the transistors TP1 and TP2.

As illustrated in FIG. 15, the output of the inverter circuit IV21 is coupled to the input of the inverter circuit IV22. The output NSAE4 of the inverter circuit IV22 is coupled to the back gates PB of the transistors TP1 and TP2, i.e., the same area as the channel of the transistors TP1 and TP2 through a capacity component C4. The transistors TP1 and TP2 are disposed in the same n-well, which is also referred to as the back gate PB. The capacity component C4 has the same features as the capacity component C1, and the description in the specification for the capacity component C1 also applies to the capacity component C4.

In FIG. 15, the latch circuit L and the inverter circuit IV35 and IV36 are omitted.

When the signal SAE is made high in order to enable the sense amplifier 13, the potentials of the back gates PB of the transistors TP1 and TP2 rise by capacity coupling. Specifically, the transistors TP1 and TP2 are applied with the forward bias, which makes the transistors TP1 and TP2 easy to turn on.

When the transistors TP1 and TP2 are forward-biased without the forward bias to the transistors TN1 and TN2, the output NSAE may be coupled to the back gates PB through the capacity component C4 without the inverter circuits IV21 and IV22 and the capacity component C3.

As described, in the sixth embodiment, the back gates of the transistors TN1 and TN2 are coupled to the node NSAE3 through the capacity component C3, and the potential of the node NSAE3 rises after the start of the operation of the sense amplifier 13. Alternatively to or in addition to, the back gates of the transistors TP1 and TP2 are coupled to the node NSAE4 through the capacity component C4, and the potential of the node NSAE4 falls after the start of the operation of the sense amplifier 13. For this reason, the transistors TN1 and TN2 and/or the transistors TP1 and TP2 receive the forward bias, which facilitates the operation of the sense amplifier 13 going toward the steady state.

The sixth embodiment can be combined with one or more of the first to fifth embodiments. Specifically, the sixth embodiment is combined with the first embodiment, and the bias to the back gates of the transistors TN1 and TN2 and/or TP1 and TP2, and the bias to the lower potential side common node CSO are performed. Alternatively, the sixth embodiment is combined with the second embodiment, and the bias to the back gates of the transistors TN1 and TN2 and/or TP1 and TP2, and the bias to the higher potential side common node CSO2 are performed. Alternatively, the sixth embodiment is combined with the third embodiment, and the bias to the back gates of the transistors TN1 and TN2 and/or TP1 and TP2, and the bias to the common nodes CSO and CSO2 are performed. Furthermore, the sixth embodiment is applicable to the sense amplifier of the structure of the fourth embodiment. The following embodiments relate to some of these various combinations of embodiments.

Seventh Embodiment

Figure 16:
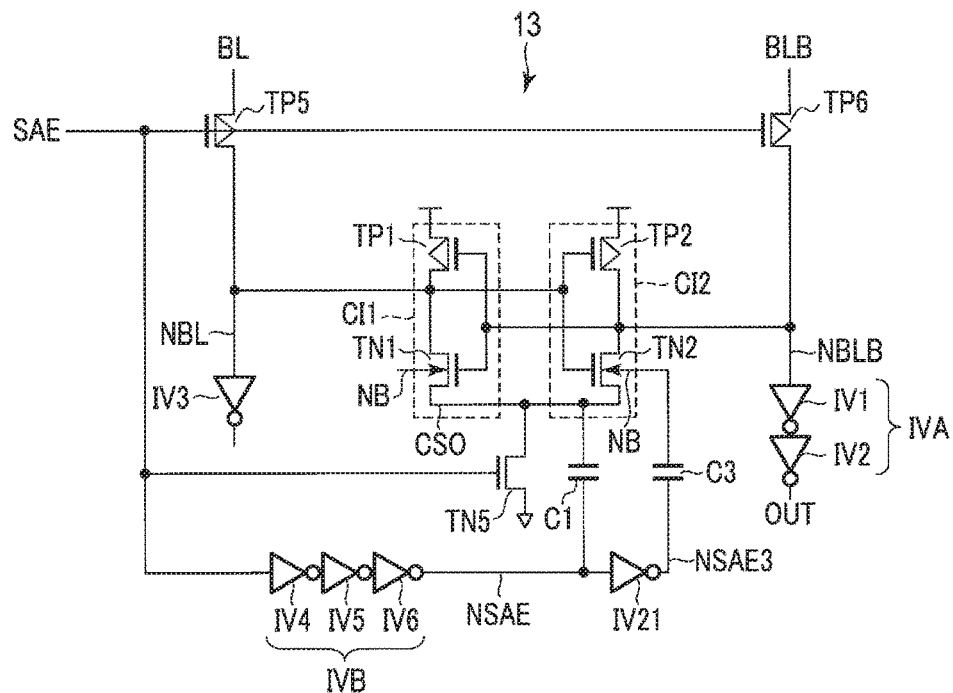
FIG. 16 illustrates components and connections of a sense amplifier of a seventh embodiment.
Figure 17:
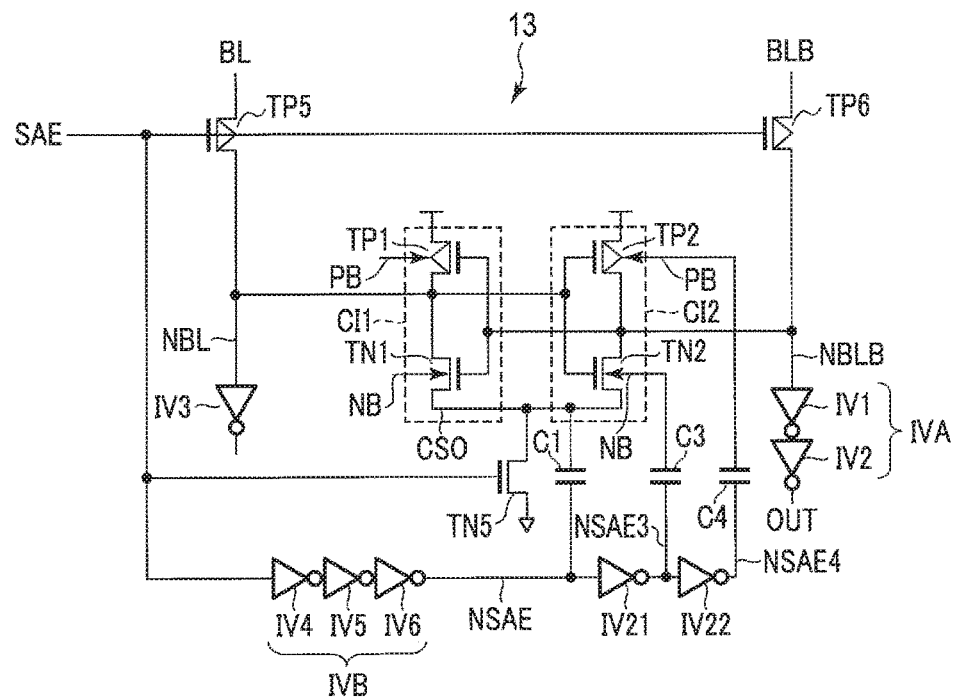
FIG. 17 illustrates a second example of components and connections of a sense amplifier of the seventh embodiment.

The seventh embodiment is a combination of the sixth and first embodiments. FIGS. 16 and 17 illustrate components and connections of sense amplifiers of the seventh embodiment, and are based on FIG. 5 (first embodiment).

As illustrated in FIG. 16, the sense amplifier 13 includes the structure of FIG. 5, and further includes the inverter circuit IV21 and the capacity component C3 as in the sixth embodiment. Alternatively, as illustrated in FIG. 17, the sense amplifier 13 includes the structure of FIG. 5, and further includes the inverter circuits IV21 and IV22 and the capacity components C3 and C4 as in the sixth embodiment. In order to forward-bias the transistors TN1 and TN2 without forward-biasing the transistors TP1 and TP2, the inverter circuits IV21 and IV22 and the capacity component C3 may not be disposed and the output NSAE may be coupled to the back gates PB through the capacity component C4. In FIGS. 16 and 17, the latch circuit L and the inverter circuits IV35 and IV36 are omitted.

According to the seventh embodiment, the advantages of the first and the sixth embodiments can be obtained. Specifically, the sense amplifier operates faster than that of the first or sixth embodiment, or it consumes less current than that of the sixth embodiment.

Eighth Embodiment

The eighth embodiment is a combination of the sixth and third embodiments. FIG. 18 illustrates components and connections of a sense amplifier of the eighth embodiment, and is based on FIG. 11 (third embodiment).

As illustrated in FIG. 18, the sense amplifier 13 includes the structure of FIG. 11, and further includes the inverter circuits IV21 and IV22 and the capacity components C3 and C4 as in the sixth embodiment. Only the set of the inverter circuit IV21 and the capacity component C3 may be disposed. Alternatively, the inverter circuits IV21 and IV22 and the capacity component C3 may not be disposed, and the output NSAE may be coupled to the back gates PB through the capacity component C4. In FIG. 18, the latch circuit L and the inverter circuit IV35 and IV36 are omitted.

According to the eighth embodiment, the advantages of the third and sixth embodiments can be obtained. Specifically, the sense amplifier operates faster than that of the third or sixth embodiment, or it consumes less current than that of the third or sixth embodiment.

Ninth Embodiment

The ninth embodiment is a combination of the sixth and fourth embodiments. FIG. 19 illustrates components and connections of a sense amplifier of the ninth embodiment, and is based on FIG. 12 (fourth embodiment).

As illustrated in FIG. 19, the sense amplifier 13 includes the structure of FIG. 12, and further includes the inverter circuits IV21 and IV22 and the capacity components C3 and C4 as in the sixth embodiment. Only the set of the inverter circuit IV21 and the capacity component C3 may be disposed. Alternatively, the inverter circuits IV21 and IV22 and the capacity component C3 may not be disposed, and the output NSAE may be coupled to back gates TP2 through the capacity component C4. In FIG. 19, the latch circuit L and the inverter circuit IV35 and IV36 are omitted.

Moreover, the sense amplifier 13 of FIG. 13 (fifth embodiment) may include the set of the inverter circuit IV21 and the capacity component C3, and/or the set of the inverter circuit IV22 and the capacity component C4. Furthermore, the sense amplifier 13, in the combination of the fourth and fifth embodiments, may include the set of the inverter circuit IV21 and the capacity component C3, and/or the set of the inverter circuit IV22 and the capacity component C4.

According to the ninth embodiment, the advantages of the fourth and the sixth embodiments can be obtained. Specifically, the sense amplifier operates faster than that of the fourth or sixth embodiment, or it consumes less current than that of the fourth or sixth embodiment.

Not only the combinations as in the seventh to the ninth embodiments, but any combination of the first to sixth embodiments is possible.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A determination circuit comprising:
a first inverter circuit;
a second inverter circuit which has a higher potential side node coupled to a higher potential side node of the first inverter circuit at a first node, has a lower potential side node coupled to a lower potential side node of the first inverter circuit at a second node, includes an input coupled to an output of the first inverter circuit, a first bit line, and a first signal line, and includes an output coupled to an input of the first inverter circuit, a second bit line, and a second signal line;
a first transistor which turns on when receiving an asserted first signal; and
a first capacity component including a first end which receives an inversion signal of the first signal, wherein
the first node is coupled to a first potential node, the first transistor is coupled between the second node and a second potential node having a lower potential than a potential of the first potential node, and a second end of the first capacity component is coupled to the second node, or
the second node is coupled to the second potential node, the first transistor is coupled between the first potential node and the first node, and the second end of the first capacity component is coupled to the first node, and
the first signal is supplied to the first end of the first capacity component through odd logic inverters coupled in series.

2. The circuit of claim 1, wherein:
the first inverter circuit comprises a first resistance element or a p-type first MOSFET, and an n-type second MOSFET coupled in series to the first resistance element or the first MOSFET,
an end of the first resistance element or the first MOSFET opposite the second MOSFET is the higher potential side node of the first inverter circuit,
a source of the second MOSFET is the lower potential side node of the first inverter circuit,
the second inverter circuit comprises a second resistance element or a p-type third MOSFET, and an n-type fourth MOSFET coupled in series to the second resistance element or a third MOSFET,
an end of the second resistance element or the third MOSFET opposite the fourth MOSFET is the higher potential side node of the second inverter circuit, and
a source of the fourth MOSFET is the lower potential side node of the second inverter circuit.

3. The circuit of claim 1, wherein:
the first potential node receives a power potential, and the second potential node receives a ground potential.

4. The circuit of claim 1, wherein:
the first transistor is coupled between the second node and the second potential node,
the second end of the first capacity component is coupled to the second node, and
the determination circuit further comprises:
a second transistor which is coupled between the first node and the first potential node and turns on when receiving an asserted inversion signal of the first signal, and
a second capacity component which includes a first end which receives an inversion signal of the first signal and a second end coupled to the first node.

5. The circuit of claim 4, wherein:
the first signal is input to the first end of the first capacity component through odd logic inverters coupled in series, and coupled to the first end of the second capacity component through even logic inverters coupled in series.

6. The circuit of claim 4, wherein:
the first inverter circuit comprises a first resistance element or a p-type first MOSFET, and an n-type second MOSFET coupled in series to the first resistance element or the first MOSFET, an end of the first resistance element or the first MOSFET opposite the second MOSFET is the higher potential side node of the first inverter circuit, a source of the second MOSFET is the lower potential side node of the first inverter circuit, the second inverter circuit comprises a second resistance element or a p-type third MOSFET, and an n-type fourth MOSFET coupled in series to the second resistance element or a third MOSFET, an end of the second resistance element or the third MOSFET opposite the fourth MOSFET is the higher potential side node of the second inverter circuit, and a source of the fourth MOSFET is the lower potential side node of the second inverter circuit.

7. The circuit of claim 4, wherein:

the first potential node receives a power potential, and the second potential node receives a ground potential.

8. The circuit of claim 1, wherein:

at least one of the first inverter circuit and the second inverter circuit includes at least one transistor formed in a well, and the determination circuit further comprises a second capacity component which has a first end coupled to the well and a second end which receives the first signal or an inversion signal of the first signal.

* * * * *